United States Patent [19]
Collins et al.

[11] Patent Number: 5,724,009
[45] Date of Patent: Mar. 3, 1998

[54] CRYSTAL OSCILLATOR HAVING INPUT/OUTPUT PINS SELECTIVELY USED FOR ANALOG OR DIGITAL SIGNALS

[75] Inventors: Timothy Collins, Downers Grove; Gregory Pucci, Batavia, both of Ill.

[73] Assignee: Motorola Inc., Schaumburg, Ill.

[21] Appl. No.: 739,339

[22] Filed: Oct. 29, 1996

[51] Int. Cl.[6] .................................................. H03B 5/32
[52] U.S. Cl. ..................... 331/108 C; 331/158; 331/176; 331/177 R; 326/38
[58] Field of Search .......................... 331/108 C, 108 D, 331/158, 176, 177 R; 326/37, 38

[56] References Cited

U.S. PATENT DOCUMENTS

| | | | |
|---|---|---|---|
| 5,010,307 | 4/1991 | Strandberg | 331/116 FE |
| 5,453,719 | 9/1995 | Narahara | 331/49 |
| 5,563,526 | 10/1996 | Hastings et al. | 326/37 |

*Primary Examiner*—Siegfried H. Grimm
*Attorney, Agent, or Firm*—Brian M. Mancini

[57] ABSTRACT

A digital temperature compensated crystal oscillator (10) with pin multiplex control which includes: four analog I/O pins, a signal multiplex method which allows switchable digital communication via at least two of the analog I/O pins (20,28), and an external mode selector (12) which operates through the power leads. Changes in the power voltage level selects the TCXO (10) to operate in a normal or communication operating mode. In the normal operating mode the TCXO operates in a normal analog manner. In the communication mode, the analog functions of the I/O pins (20,28) are switched out and digital functions are allowed on the same I/O pins (20,28). The use of the same I/O pins (20,28) for switchable analog and digital signals saves size and cost, and prevents the inadvertent access to the digital functions of the TCXO (10) by customers in the field.

21 Claims, 4 Drawing Sheets

10

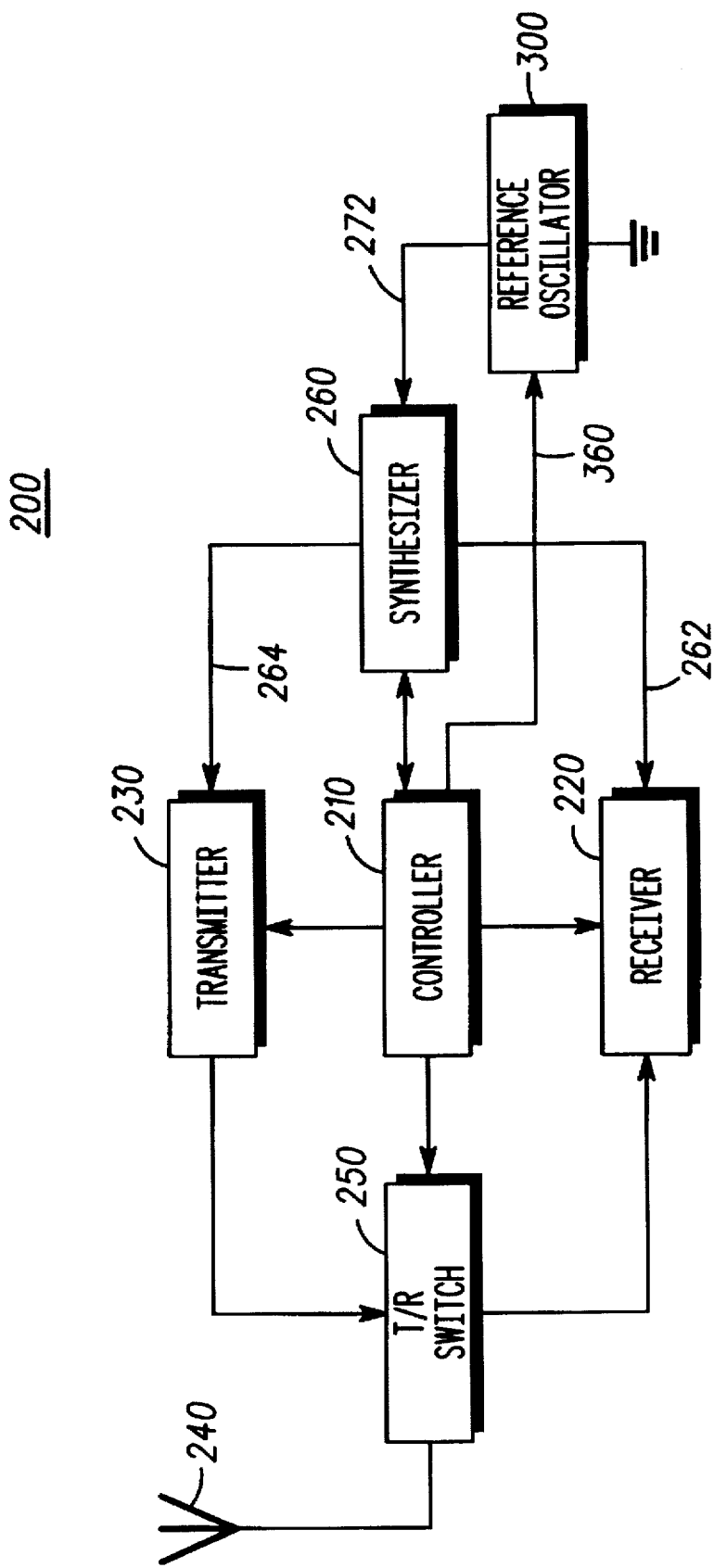

CRYSTAL OSCILLATOR HAVING INPUT/ OUTPUT PINS SELECTIVELY USED FOR ANALOG OR DIGITAL SIGNALS

FIELD OF THE INVENTION

The invention relates generally to the field of analog and digital electronic circuits, and in particular, to a temperature compensated crystal oscillator with pin multiplex control and method for producing the same.

BACKGROUND OF THE INVENTION

A temperature compensated crystal oscillator (TCXO) contains circuitry for providing a stable output frequency. Prior art TCXO's also provide external connections that allow adjustment of the output frequency. The external connections may be analog or digital in nature. For example, referring to FIG. 1, a prior art analog TCXO typically has four external leads; a power pin ($V_{DD}$), a ground pin, an RF frequency output pin, and a frequency adjust (warp) pin. The warp pin is used to adjust the output frequency of the TCXO to a desired nominal frequency. However, any adjustment of the temperature compensation function can only be done internally, while the TCXO is still open.

A prior art digital TCXO has the same four leads of the analog TCXO in addition to a set of digital I/O leads for digitally communicating with the internal circuitry. These digital I/O leads allow external adjustment of the digital temperature compensation function of the TCXO after it is sealed. This communication capability is used to read-in or read-out data that is required to temperature compensate the TCXO. The digital I/O leads are often not required in the end-user application. Referring to FIG. 2, this communication interface typically consists of several dedicated I/O connections such as clock, data in, data out, and parallel bus enable/chip select leads.

The extra I/O pins on a digital TCXO add size and cost to the TCXO, and they require additional manufacturing operations, such as wirebonding, which potentially add failure modes to the TCXO, reducing overall reliability. Further, through the availability of the external I/O pins, there may be instances where the internal TCXO memory is inadvertently changed or erased in the field which destroys the usefulness of the TCXO.

The need exists for a new TCXO which; retains the digital functionality of existing digital TCXOs, prevents inadvertent access to the internal circuitry of the TCXO, improves manufacturability, improves reliability, and uses a minimum pin count.

BRIEF DESCRIPTION OF THE DRAWINGS

FIG. 7 is a block diagram of a communication device which uses the TCXO of the present invention.

DETAILED DESCRIPTION OF THE PREFERRED EMBODIMENT

The present invention provides pin multiplexed analog and digital communication in an electronic circuit. The multiplex action switchably allows either analog or digital signals to pass on a single input/output (I/O) pin of the electronic circuit. Further, the present invention allows a plurality of analog and digital signals to be multiplexed to a common I/O pin. In addition, multiple I/O pins may be used to further enhance signal flexibility. The advantage of the present invention is that a pin count of the electronic circuit is minimized. This, in turn, improves circuit manufacturability and cost by lessening the amount of circuit connections needed within the electronic circuit. Also, any signal functionality to be protected from inadvertent access may be protected by switchably denying access to those particular functions.

In one embodiment, the present invention includes an analog and digital electronic circuit including a switching lead, at least one input/output pin, and a switching circuit. The switching lead is coupled to the switching circuit which is coupled to the input/output pin. The switching circuit includes at least a first and second operating mode. The first operating mode allows analog communication with the circuit via the input/output pin when a first signal, or control potential, is applied to the switching lead to control the switching circuit. The second operating mode allows digital communication with the circuit via the same input/output pin when a second signal, or control potential, is applied to the switching lead to control the switching circuit. In this way, at least one pin of an electronic circuit can accommodate both analog and digital signal functionality. This functionality can be applied to any circuit that contains a non-volatile memory, including a voltage regulator, power supply, or a power amplifier.

Figure 1:
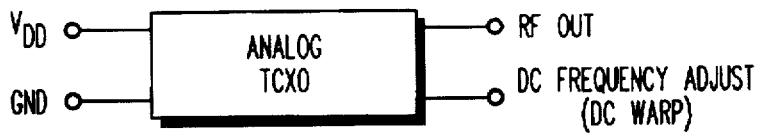
FIG. 1 is a diagram of an I/O pin configuration for a prior art analog TCXO.
Figure 2:
FIG. 2 is a diagram of an I/O pin configuration for a prior art digital TCXO.
Figure 3:
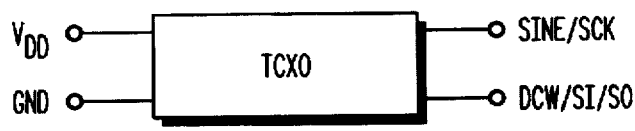
FIG. 3 is a diagram of an I/O pin configuration for a TCXO with signal multiplexing that allows digital communication via analog I/O pins, in accordance with the present invention.

FIG. 3 shows a diagram of a TCXO 10 having an I/O pin configuration for analog and digital communication, in accordance with the present invention, without the addition of I/O pins over the four pin configuration shown in FIG. 1. In the present invention, a mode selector (not shown) provides a switching signal the TCXO 10 to cause the TCXO 10 to switch between a Normal operating mode and a Communication mode.

In the Normal operating mode, the four I/O pin functions are: two power leads ($V_{DD}$ and ground (GND)), an RF output (SINE), and a DC frequency adjust or warp (DCW). In this mode, no digital communication can occur, and the circuit operates in a normal analog mode. In the Communication operating mode, the four I/O pin functions are: two power leads ($V_{DD}$ and ground (GND)), a shift-clock-input (SCK), and switchable serial data in/out (SI/SO). In this mode, the circuit operates in a digital mode for transferring serial data, preferably.

The switching signal from the mode selector may be provided on a separate lead, but it is possible for the switching signal be carried on one of the four already existing I/O pins. Preferably, one of the power leads is used to carry the switching signal which consists of differing potential levels. In order to switch to the Communication mode, one of the power leads is connected to a potential which is outside the normal supply potential range. In a preferred embodiment, this potential is connected to the $V_{DD}$ pin and is higher than the normal supply potential range so as to provide sufficient potential to power the rest of the circuit. However, it should be recognized that the same result could be obtained for a potential applied to the ground pin at a lower potential than ground. Further, in either case, a potential may be applied that is less than the normal supply potential range as long as sufficient power is available to drive the digital circuitry.

One problem to overcome is that periodic transient conditions or power glitches can occur in the field which could cause the TCXO to switch into the digital communication mode. In order to avoid inadvertent switching of the TCXO into the digital communication mode, it is preferable that the mode selector signal is timed for a predetermined period to confirm mode selection. For example, a mode selector signal requesting the TCXO to switch to the Communication mode must be present on the $V_{DD}$ pin for a predetermined time period before the switch to the Communication mode is allowed. It should be recognized that various combinations of analog and digital functionalities may be combined on the I/O pins. For example, the analog DCW and RF output (SINE) functions may be interchanged.

Figure 4:
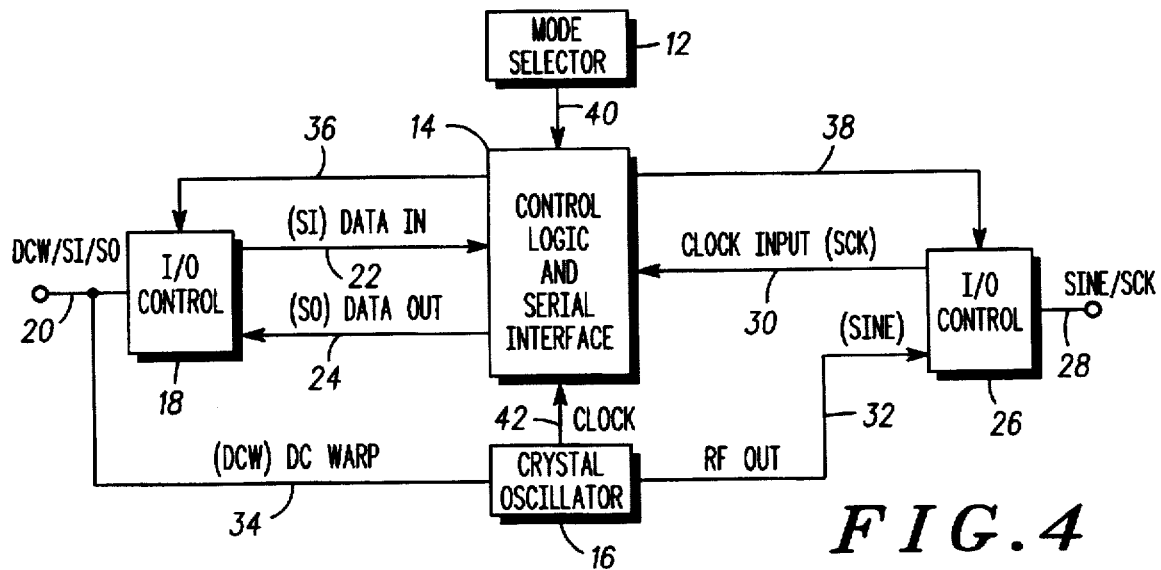
FIG. 4 is a block diagram of one embodiment of the TCXO of FIG. 3, in accordance with the present invention.

Referring to FIG. 4, an electronic circuit, representing a TCXO 10, in accordance with the present invention, is provided. The circuit includes a control logic circuit and a serial interface (CL&SI) 14, a crystal oscillator 16, and at least two I/O controls coupled to respective I/O pins and being controlled by a control logic circuit by first and second control lines, respectively. The CL&SI 14 contains a control logic circuit and a serial interface circuit. It should be recognized that control logic circuits and serial interfaces are known in the art.

A first I/O control 18 is electrically coupled to a first I/O pin 20 and switchably connects the first I/O pin 20 to either a digital serial data-in (SI) line 22 or a digital serial data-out (SO) line 24. The data-in line 22 and data-out line 24 are electrically coupled to the serial interface circuit. A second I/O control 26 is electrically coupled to a second I/O pin 28 and switchably connects the second I/O pin 28 to the CL&SI 14. The interface circuit is adapted to input digital data over the data-in line 22 and output digital data over the data-out line 24. The clock-input line 30 is used to provide clock signals from the second I/O pin 28 to clock data either into or out of the interface circuit. A first and second analog line are coupled from the crystal oscillator to the first and second I/O pins 20,28, respectively.

In one embodiment, the first analog line is a DC warp (DCW) line 34 which electrically couples the first I/O pin 20 to a frequency tuning circuit of the crystal oscillator 16. The DCW line may be coupled either through the first I/O control or directly from the first I/O pin 20 to the crystal oscillator 16. The second analog line is a RF output line 32 coupled through the second I/O control 26 and is controlled by the second control line 38.

In an alternative embodiment, the DCW line 34 and RF output line 32 are interchanged. In this case, the first analog line is the RF output line 32. The first I/O control 18 is electrically coupled to the first I/O pin 20 and switchably connects the first I/O pin 20 to either the data-in line 22, the data-out line 24 or the RF output line 32. The data-in line 22 and data-out line 24 are electrically coupled to the serial interface circuit. The RF output line 32 is coupled to a frequency output of the crystal oscillator 16. The second analog line is the DCW line. The second I/O control 26 is electrically coupled to the second I/O pin 28 and switchably connects the second I/O pin 28 to the CL&SI 14 through the clock-input line 30. The DCW line 34 electrically couples the second I/O pin 20 to a frequency tuning circuit of the crystal oscillator 16. This connection may be direct or via the second I/O control 26. The control logic circuit provides first and second control lines 36,38 for the first and second I/O controls 18,26, respectively.

A mode selector 12 is electrically coupled to the control logic circuit. The mode selector 12 generates a switching signal 40 which directs the control logic circuit to switch the first and second I/O control 18,26 via the first and second control lines 36,33, respectively. Preferably, the mode selector 12 consists of a threshold comparator having a first input connected to a reference voltage and a second input connected to a voltage sensing circuit which is coupled to a power lead. The comparator, when sensing a voltage condition outside of a normal reference voltage range, provides a switching signal 40 to the control logic circuit indicating that digital communication is desired.

The mode selector 12 provides a first or second switching signal 40 to the CL&SI 14 to indicate whether the TCXO should be operating in either Normal or Communication mode. Preferably, the first switching signal provides a low potential to indicate Normal operating mode and the second switching signal provides a high potential to indicate Communication mode.

When the switching signal 40 is of a low potential (Normal mode) the control logic circuit turns the serial interface circuit off and provides a control signal on the second control line 38 such that the second I/O control 26 disconnects the clock-input line 30 from the second I/O pin 28. The first I/O control 18 provides constant known states on the data-in and data-out lines 22,24 to prevent interference with signals on the first I/O pin 20. The first I/O pin 20 is coupled to the first analog line, preferably the DCW line 34, which is coupled to the crystal oscillator 16. The second I/O pin 28 is coupled to the crystal oscillator 16 via the second analog line, preferably the RF output line. Therefore, in Normal mode the first and second I/O pins 20,28 are used to provide an analog warp voltage to the tuning circuit of the crystal oscillator 16 and to pass the RF output of the crystal oscillator 16. Preferably, the crystal oscillator 16 analog RF output is coupled to the second I/O pin 28 through the second analog line and the second I/O control 26. The first I/O control 18 provides constant known states on the data-in and data-out lines 22,24 to prevent interference with signals on the first I/O pin 20 and couples the DCW line 34 to the first I/O pin 20 to provide an analog warp voltage to the tuning circuit of the crystal oscillator 16.

When the switching signal 40 is of a high potential (Communication mode) the control logic circuit turns the serial interface circuit on, provides a control signal on the first control line 36 such that the first I/O control 18 couples the first I/O pin 20 to the data-in line 22, and provides a control signal on the second control line 38 such that the second I/O control 26 couples the clock-input line 30 to the second I/O pin 28. The control logic circuit also acts to electrically disconnect the data-out line 24 and the RF output line 32 from its associated I/O pin. Therefore, at the initialization of the Communication mode the first I/O pin 20 is connected so as to provide serial data in to the serial interface circuit and the second pin 28 is used to provide clock signals to the serial interface circuit to clock the serial data in from the first I/O pin 20.

As long as the switching signal 40 remains at a high potential (Communication mode), commands and data can be serially loaded into the serial interface via the data-in line 22. Subsequently, the serial interface circuit receives the serial data, decodes any instructions encoded in the serial data, and initiates the desired operations directed by the instructions.

The serial data includes input command words of predetermined length. This is to prevent permanent loss of synchronization between the serial interface and an external control circuit. The CL&SI 14 continually monitors for SCK clock-input line transitions from the external control circuit. However, instead of counting transitions on the clock-input line 30, the CL&SI 14 uses a signal from a timing source clock-input 42 derived from the crystal oscillator 16 which is coupled to the CL&SI 14. When signal transitions occur on the clock-input line 30, the serial interface fills an input buffer with the input words of predetermined length. Thereafter, when there are no SCK transitions for a predetermined duration, as timed by the timing source clock 42, an input command is deemed to be completed. The action requested by the input command is subsequently performed. This methodology advantageously eliminates the need for SCK pulse counting and prevents loss of synchronization which can happen if a noise glitch occurs during command clocking.

To output serial data from the circuit to the first I/O pin 20, a input command which requests data must first be input to the serial interface circuit. This is done in the same manner as above. However, in this case, the source of the desired data is encoded in the input command. Upon receipt of this data request in the input command, the serial interface circuit retrieves the requested data from the circuit and causes the control logic circuit to reconfigure the first I/O control 18 to disconnect the data-in line 22 and connect the data-out line 24 from the serial interface circuit to the first I/O pin 20. The next burst of SCK clock pulses received by the serial interface circuit from the external circuit causes the requested data to be shifted out from the serial interface circuit to the first I/O pin 20. At the end of this burst of SCK clock pulses, a predetermined time-out period, as timed by the timing source clock 42, again indicates that data transmission is complete. At this time, the first I/O control 18 is reconfigured to connect the first I/O pin 20 to the data-in line 22. The serial interface then awaits the next input command. The DCW line 34 and RF output line 32 may be set to a default condition when digital communications are active. However, since the digital communication mode is only used during the manufacture and set up of the TCXO, this condition is not necessary. Therefore, the DCW line 34 may be left coupled in the circuit such that any signals present on the digital lines also appear on the DCW line 34. Such signals appear as noise on the DCW line 34. Any shift in crystal oscillator frequency caused by these signals on the DCW line 34 is on the order of parts per million. Therefore, any effect on the timing source clock 42, derived from the crystal oscillator 16, is inconsequential.

Figure 5:
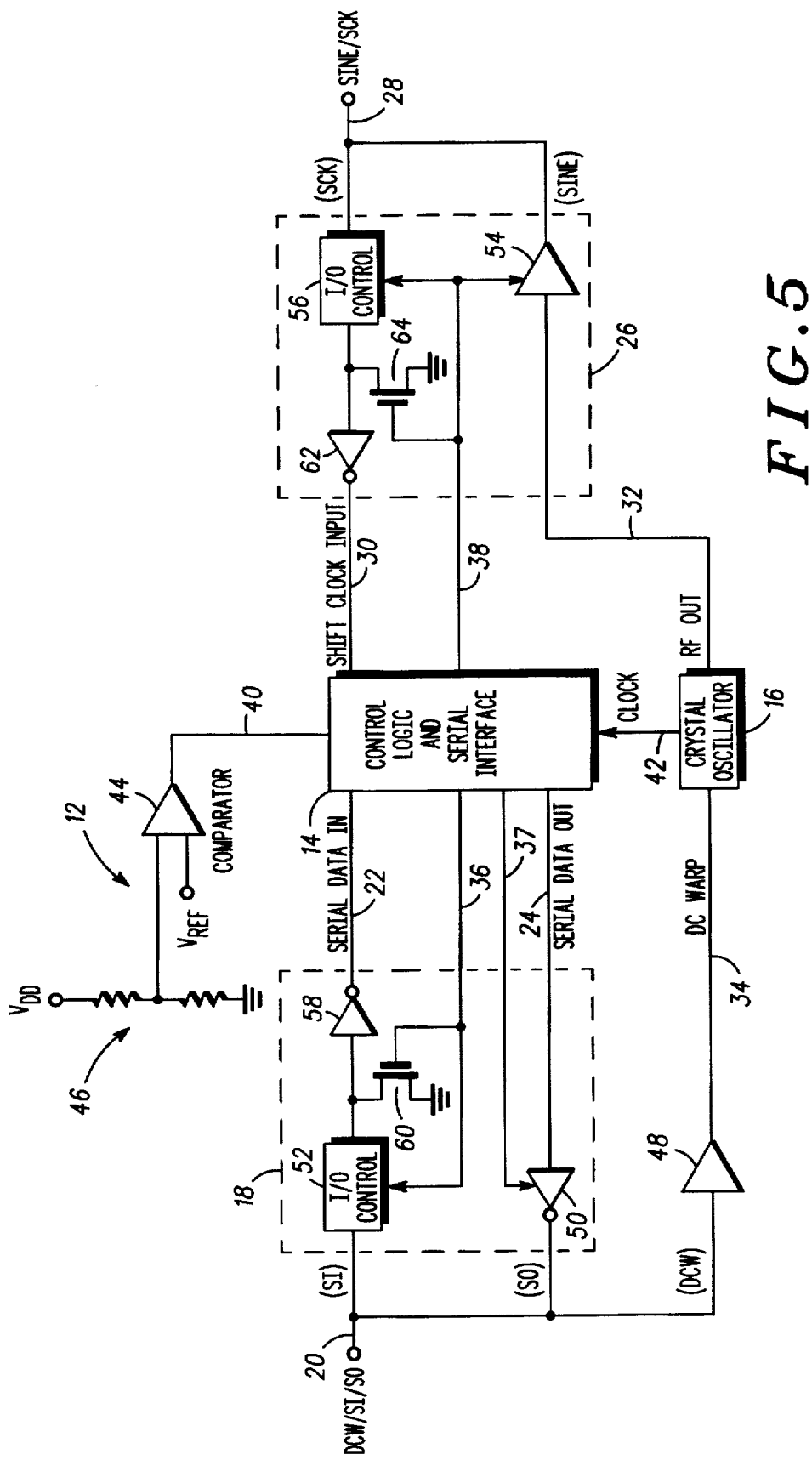
FIG. 5 is a block diagram of a preferred embodiment of the TCXO of FIG. 3, in accordance with the present invention.

In a preferred embodiment, as shown in FIG. 5, the mode selector 12 consists of a threshold comparator 44 having a first input connected to a reference voltage, $V_{REF}$, and a second input connected to a voltage sensing circuit 46 coupled to a $V_{DD}$ pin. When the comparator 44 senses a $V_{DD}$ condition outside of the normal reference voltage range, the comparator 44 provides a switching signal 40 at an output to the CL&SI 14 indicating that digital communication is desired. Also, the DCW line 34 contains a DC warp buffer 48 which may be separately controlled by the control logic circuit. The signal from the timing source clock 42 from the RF output of the crystal oscillator 16 is processed to provide a more preferable substantially square waveform. In addition, the first I/O control 18 includes a first gated switch 52 and a first tri-state buffer 50 having an input connected to the serial interface circuit and an output connected to the first I/O pin 20. The second I/O control 26 includes a second gated switch 56 coupled to the second I/O pin 28.

The first gated switch 52 is connected in the data-in line 22 and is controlled by a first control line 36. The first gated switch 52 is switched open when the control logic circuit switches the data-in line 22 off by placing a first control potential on the first control line 36. When the control logic circuit switches the data-in line 22 on, by placing a second control potential on the first control line 36, the first gated switch 52 is switched closed. More preferably, a first buffer 58 is connected in series between the first gated switch 52 and the serial interface circuit. An output of the first buffer 58 is connected to the serial interface circuit and an input of the first buffer 58 is connected to the first gated switch 52. A first pull-down transistor 60 is connected in shunt between the first gated switch 52 and the first buffer 58. The first pull-down transistor 60 is controlled by the first control line 36 connected to a gate of the transistor 60. Therefore, when the control logic circuit switches the data-in line 22 on by placing a substantially ground potential on the first control line 36, the first gated switch 52 is switched closed by the first control line 36, the gate of the first transistor 60 is unbiased through the first control line 36, and the first buffer 58 passes the serial data in from the first I/O pin 20 to the serial interface circuit. When the control logic circuit switches the data-in line 22 off by placing a high potential on the first control line 36, the first gated switch 52 is switched open and the gate of the first transistor 60 is biased through the first control line 36 so as to drive an input of the first buffer 58 to a constant potential, and an output of the first buffer 58 presents a constant state on the data-in line 22 to the serial interface. The use of the buffers and pull-down transistors advantageously control the logic states presented to the serial interface. This has the advantage of preventing extraneous signals from interfering with the operation of the CL&SI 14.

Similarly, the second gated switch 56 is connected in the clock-input line 30. The second gated switch 56 is controlled by a second control line 38. The second gated switch 56 is switched open when the control logic circuit switches the clock-input line 30 off by placing a first control potential on the second control line 38. When the control logic circuit switches the clock-input line 30 on by placing a second control potential on the second control line 38, the second gated switch 56 is switched closed. More preferably, a second buffer 62 is connected in series between the second gated switch 56 and the serial interface circuit. An output of the second buffer 62 is connected to the serial interface circuit and an input of the second buffer 62 is connected to the second gated switch 56. A second pull-down transistor 64 is connected in shunt between the second gated switch 56 and the second buffer 62. The second pull-down transistor 64 is controlled by the second control line 38 connected to a gate of the transistor 64. Therefore, when the control logic circuit switches the clock-input line 30 on by placing a substantially ground potential on the second control line 38, the second gated switch 56 is switched closed by the second control line 38, the gate of the second transistor 64 is unbiased through the second control line 38, and the second buffer 62 passes the shift clock input from the second I/O pin 28 to the serial interface circuit. When the control logic circuit switches the clock-input line 30 off by placing a high potential on the second control line, the second gated switch 56 is switched open and the gate of the second transistor 64 is biased through the second control line 38 so as to drive an input of the second buffer 62 to a constant potential, and an output of the second buffer 62 presents a constant state on the clock-input line 30 to the serial interface.

The first tri-state buffer 50 is coupled in the data-out line 24 and is controlled by a buffer control line 37 connected to the control logic circuit. The first tri-state buffer 50 presents a high output impedance to the first I/O pin 20 when the control logic circuit switches the data-out line 24 off through the buffer control line 37. When the control logic circuit switches the data-out line 24 on, the first tri-state buffer 50 allows passage of data out from the serial interface circuit to the first I/O pin 20. Similarly, in the preferred embodiment, the RF buffer 54 is connected in the RF output line 32 and controlled by the second control line 38 connected to the control logic circuit. The RF buffer 54 presents a high output impedance to the second I/O pin 28 when the control logic circuit switches the RF output line 32 off by placing a second control potential on the second control line 38, thereby substantially blocking any signals from the crystal oscillator. When the control logic circuit switches the RF output line 32 on by placing a first control potential on the second control line 38, the RF buffer 54 passes the RF output from the crystal oscillator 16 to the second I/O pin 28. Advantageously, the use of the buffers substantially disconnects the data-out and RF output lines 24,32 from the I/O pins 20,28. It should be noted that the aforementioned buffers may be of the inverting or non-inverting type depending on the desired configuration of the data. In addition, gated switches may be used in place of the buffers.

In an alternate preferred embodiment, the output of the DC warp buffer 48 is coupled to the tuning circuit of the crystal oscillator 16 and the input of the DC warp buffer 48 is coupled to the second I/O pin 28. The input of the RF buffer 54, which is part of the first I/O control 18, is coupled to the output of the crystal oscillator 16 through the RF output line 32. The output of the RF buffer 54 is coupled to the first I/O pin 20. In this case, a second buffer control line is needed from the control logic circuit to control the RF buffer 54. The second buffer control line is controlled independently from the first control line 36 and the buffer control line 37. Also, the second control line 38 is used to control the second gated switch 56 and the second transistor 64, only.

Figure 6:
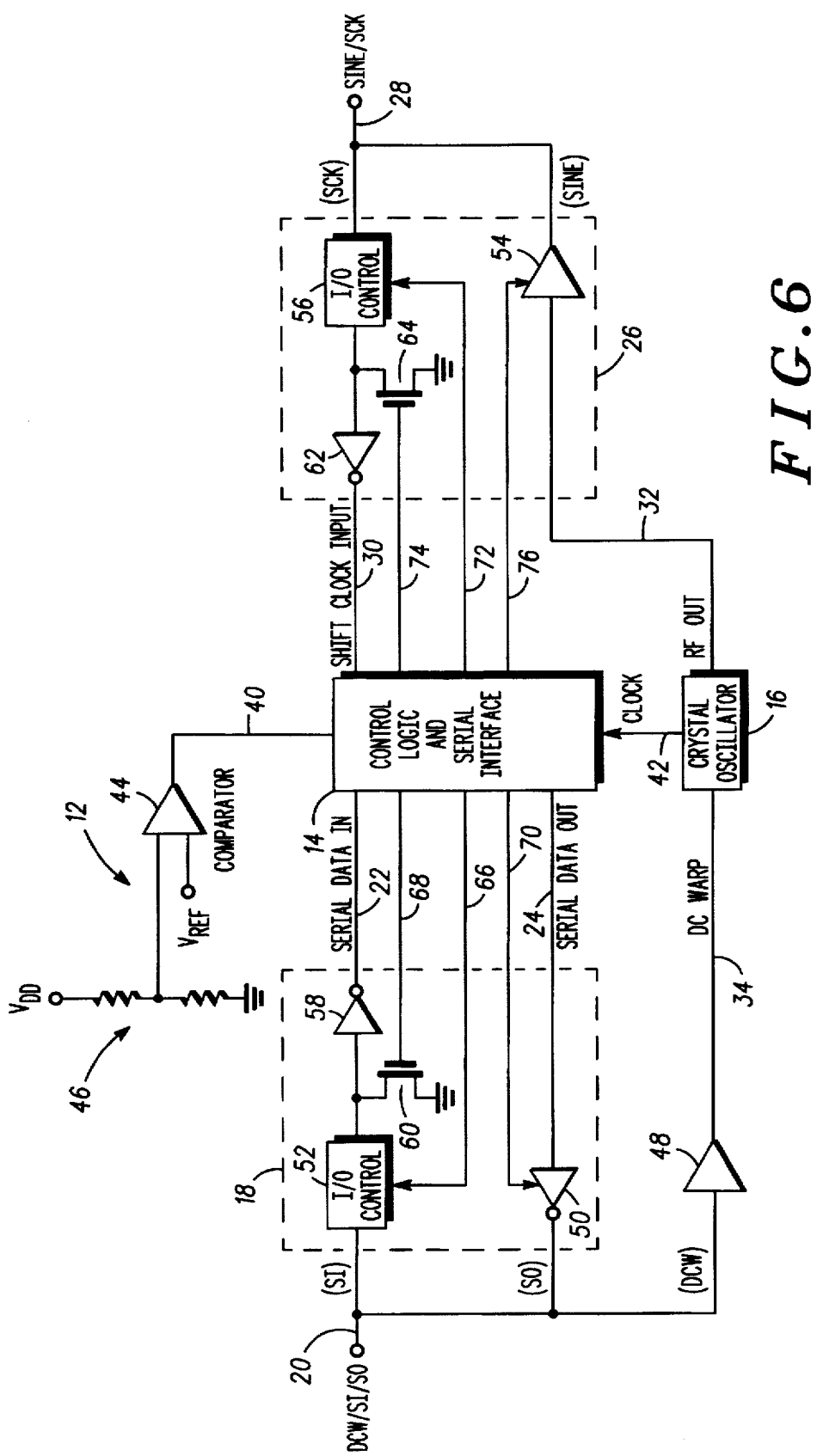
FIG. 6 is a block diagram of an embodiment of the TCXO of FIG. 5 using separate logic control lines, in accordance with the present invention.

Referring to FIG. 6, in a more preferred embodiment, the function of the first control line 36 and buffer control line 37 of FIG. 5 is divided into a first primary control line 66 for controlling the first gated switch 52, a first secondary control line 68 for controlling the first transistor 60, and a first tertiary control line 70 for controlling the first tri-state buffer 50. This has the advantage of allowing the use of more simplified gate designs that can be operated by desired potentials. Simplified gate design contributes to lower cost, smaller switches and lower current drain. For example, it may be desired to have both the first gated switch 52 and the first tri-state buffer 50 conduct (switch closed) on a high potential. In this case, it is necessary to provide separate control lines to each of the first buffer 58, transistor 60 and tri-state buffer 50.

Similarly, the function of the second control line 38 of FIG. 5 is divided into a second primary control line 72 for controlling the second gated switch 56, a second secondary control line 74 for controlling the second transistor 64, and a second tertiary control line 76 for controlling the RF buffer 54. For example, it may be desired to have both the second gated switch 56 and the RF buffer 54 conduct (switch closed) on a high potential. In this case, it is necessary to provide separate control lines to each of the second gated switch 56, transistor 64 and RF buffer 54.

In this more preferred embodiment, the first gated switch 52 is controlled by a first primary control line 66. The first pull-down transistor 60 is controlled by a first secondary control line 68 connected to a gate of the transistor 60. Therefore, when the control logic circuit switches the data-in line 22 on, the first gated switch 52 is switched closed by the first primary control line 66, the gate of the first transistor 60 is biased off by a substantially ground potential on the first secondary control line 68, and the first buffer 58 passes the serial data in from the first I/O pin 20 to the serial interface. When the control logic circuit switches the data-in line 22 off, the first gated switch 52 is switched open by the first primary control line 66, the gate of the first transistor 60 is biased to conduct by a high potential on the first secondary control line 68 so as to drive an input of the first buffer 58 to a constant potential, and an output of the first buffer 58 presents a constant state on the data-in line 22 to the serial interface.

Similarly, the second gated switch 56 is controlled by a second primary control line 72. The second pull-down transistor 64 is controlled by a second secondary control line 74 connected to a gate of the transistor 64. Therefore, when the control logic circuit switches the clock-input line 30 on, the second gated switch 56 is switched closed by the second primary control line 72, the gate of the second transistor 64 is biased off by a substantially ground potential on the second secondary control line 74, and the second buffer 62 passes the shift clock input from the second I/O pin 28 to the serial interface. When the control logic circuit switches the clock-input line 30 off, the second gated switch 56 is switched open by the second primary control line 72, the gate of the second transistor 64 is biased to conduct by a high potential on the second secondary control line 74 so as to drive an input of the second buffer 62 to a constant potential, and an output of the second buffer 62 presents a constant state on the clock-input line 30 to the CL&SI 14.

The first tri-state buffer 50 is coupled in the data-out line 24 and is controlled by a first tertiary control line 70 connected to the control logic circuit. The first tri-state buffer 50 presents a high output impedance to the first I/O pin 20 when the control logic circuit switches the data-out line 24 off through the first tertiary control line 70. When the control logic circuit switches the data-out line 24 on, the first tri-state buffer 50 passes serial data out from the serial interface to the first I/O pin 20. Similarly, the RF buffer 54 is connected in the RF output line 32 and controlled by a second tertiary control line 76 connected to the control logic circuit. The RF buffer 54 presents a high output impedance to the second I/O pin 28 when the control logic circuit switches the RF output line 32 off through the second tertiary control line 76. When the control logic circuit switches the RF output line 32 on, the RF buffer 54 passes RF output from the crystal oscillator 16 to the second I/O pin 28. Advantageously, the use of buffers substantially disconnects the data-out and RF output lines 24,32 from the I/O pins 20,28.

In an alternate more preferred embodiment, the output of the DC warp buffer 48 is coupled to the tuning circuit of the crystal oscillator 16 and the input of the DC warp buffer 48 is coupled to the second I/O pin 28. The input of the RF buffer 54 which is part of the first I/O control 18 is coupled to the output of the crystal oscillator 16 through the RF output line 32. The output of the RF buffer 54 is coupled to the first I/O pin 20.

In one aspect of the present invention a method is provided for providing multiplexed analog and digital communication on an I/O pin of an electronic circuit. This method includes a first step of providing a switching lead, an I/O pin, and an electronic circuit having at least a first and second operating mode, the electronic circuit being connected to the switching lead and coupled to the I/O pin. In one embodiment, the first and second operating modes consist of the aforementioned Normal and Communication mode of operation for a TCXO. In particular, this step includes the switching lead being a power lead of the circuit such that the power lead supplies power and the control potentials to the circuit. In a preferred embodiment, this step includes the switching lead having a comparator circuit connected to a power lead and a reference voltage such that a potential on the power lead which is greater than the reference voltage causes the comparator to drive the switching circuit to switch to the first operating mode and a potential on the power lead which is less than the reference voltage causes the comparator to drive the switching circuit to switch to the second operating mode.

A next step includes applying a first control potential to the switching lead such that the electronic circuit switches to the first operating mode which allows analog communication to the circuit on the I/O pin. A last step includes applying a second control potential to the switching lead such that the electronic circuit switches to the second operating mode which allows digital communication to the circuit on the I/O pin. In a preferred embodiment, the TCXO includes four I/O pins in which at least two of the pins are switchable between analog and digital communication. Further, one of the power leads to the TCXO serves at least two functions: to supply power, and to provide different control potentials to the electronic circuit.

FIG. 7 shows a block diagram of a communication device 200 which includes the temperature compensated crystal oscillator circuit as a reference oscillator 300, in accordance with the present invention. In one embodiment, the communication device 200 is a transceiver. The communication device 200 comprises a well known frequency synthesized two-way transceiver which operates under the control of a controller 210. The communication device 200 includes a receiver 220 and a transmitter 230 which receive and transmit RF via an antenna 240. The antenna 240 is appropriately switched between the receiver 220 and the transmitter 230 by an antenna switch 250. The communication device 200 also includes a well known phase locked loop synthesizer 260 which under the control of the controller 210 provides a receiver local oscillator signal 262 and a transmitter local oscillator signal 264. A reference oscillator 300 provides a reference oscillator signal 262 for the synthesizer 260. The reference oscillator signal 262 is temperature compensated utilizing the principles of the present invention.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. An analog and digital electronic circuit, comprising:
   a power lead, an input/output pin, and a switching circuit, the power lead coupled to the switching circuit and the switching circuit coupled to the input/output pin;
   a first operating mode allowing analog communication with the analog and digital electronic circuit via the input/output pin when a first signal is applied to the power lead to control the switching circuit; and
   a second operating mode allowing digital communication with the analog and digital electronic circuit via the input/output pin when a second signal is applied to the power lead to control the switching circuit.

2. A temperature compensated crystal oscillator circuit, comprising:
   a crystal oscillator electrically coupled to a first and a second I/O pin via respective first and second analog lines;
   a control logic circuit and an interface circuit electrically coupled to a digital data-in line, a digital data-out line, and a digital clock-input;
   a first and a second I/O control having respective first and second control lines each of which are electrically coupled to the control logic circuit;
   the first I/O control is electrically coupled to the first I/O pin and switchably connects the first I/O pin between the digital data-in line and the digital data-out line each of which are electrically coupled to the interface circuit;
   the second I/O control is electrically coupled to the second I/O pin and switchably connects the second I/O pin to the digital clock-input line which is coupled to the interface circuit; and
   the interface circuit is adapted to input a digital data-in signal from the first I/O pin via the first I/O control, receive a digital clock-input signal from the second I/O pin via the second I/O control, and output a digital data-out signal to the first I/O pin via the first I/O control, the digital clock-input line for clocking the data-in and data-out signals respectively into and out of the interface circuit.

3. The circuit of claim 2, further comprising:
   a mode selector being electrically coupled to the control logic circuit, the mode selector generating a switching signal which directs the control logic circuit to switch the first and second I/O controls via the first and second control lines, respectively;
   a normal operating mode wherein the mode selector provides a first switching signal to the control logic circuit whereupon the control logic circuit drives the first and second I/O controls to couple analog signals between the crystal oscillator and the first and second I/O pins, respectively; and
   a communication mode wherein the mode selector provides a second switching signal to the control logic circuit whereupon the control logic circuit drives the first and second I/O controls to couple digital signals between the interface circuit and the first and second I/O pins, respectively.

4. The circuit of claim 3, wherein the mode selector consists of a threshold comparator having a first input connected to a reference voltage and a second input connected to a voltage sensing circuit which is coupled to a power lead, the comparator when sensing a voltage condition outside of a normal reference voltage range provides a switching signal to the control logic circuit indicating that digital communication is desired.

5. The circuit of claim 3, wherein the communication mode provides for digital data output where an input command received through the data-in line includes a request for data from the circuit, the input command directing the interface circuit to retrieve the desired data and directing the control logic circuit to provide a control signal on the first control line such that the first I/O control couples the first I/O pin to receive digital data from the interface circuit through the data-out line, and the second I/O pin being used to provide signals to the interface circuit to clock the desired data out to the first I/O pin.

6. The circuit of claim 2, wherein the first analog line is a DC warp line coupled between the first I/O pin and an input of the crystal oscillator, and the second analog line is a RF output line coupled between a frequency output of the crystal oscillator and the second I/O control, the second I/O control switchably connects the second I/O pin between the clock-input line and the RF output line.

7. The circuit of claim 6, wherein:

the first I/O control includes a first gated switch connected in series with the data-in line and controlled by the control logic circuit via a first control line and a first tri-state buffer connected in series with the data-out line and controlled by the control logic circuit via a buffer control line, the first tri-state buffer having an input connected to the interface circuit and an output connected to the first I/O pin, the first control line and buffer control line independently controlled by the control logic circuit to pass digital data on no more than one of the data-in line and the data-out line; and the second I/O control includes a second gated switch connected in series with the clock-input line and a RF buffer connected in series with the RF output line, the second gated switch and RF buffer commonly controlled by the control logic circuit via a second control line, the RF buffer having an input connected to an output of the crystal oscillator and an output connected to the second I/O pin, a first control potential on the second control line causing the second gated switch to pass data and the RF buffer to substantially block a signal, a second control potential on the second control line causing the second gated switch to substantially block data and the RF buffer to pass a signal.

8. The circuit of claim 7, wherein:

the first I/O control includes a first buffer and a first pull-down transistor, the first buffer is connected in series between the first gated switch and the interface circuit, an output of the first buffer is connected to the interface circuit and an input of the first buffer is connected to the first gated switch, the first pull-down transistor is connected in shunt between the first gated switch and the first buffer, the first control line is commonly connected to the first gated switch and a gate of the first pull-down transistor, a substantially ground potential on the first control line causes the first gated switch to switch closed and the gate of the first transistor to be biased off and the first buffer to pass data in from the first I/O pin through the first gated switch to the interface circuit, a high potential on the first control line causes the first gated switch to be switched open and the gate of the first transistor to be biased to conduct so as to drive the input of the first buffer to a constant potential such that an output of the first buffer presents a constant state to the interface circuit; and the second I/O control includes a second buffer and a second pull-down transistor, the second buffer is connected in series between the second gated switch and the interface circuit, an output of the second buffer is connected to the interface circuit and an input of the second buffer is connected to the second gated switch, the second pull-down transistor is connected in shunt between the second gated switch and the second buffer, the second switch includes a second control line commonly connected to the second gated switch, a gate of the second pull-down transistor and the RF buffer, a substantially ground potential on the second control line causes the RF buffer to substantially block signals, the second gated switch to switch closed, the gate of the second transistor to be biased off and the second buffer to pass digital signals in from the second I/O pin through the second gated switch to the interface circuit, a high potential on the second control line causes the RF buffer to pass a signal, the second gated switch to be switched open and the gate of the second transistor to be biased to conduct so as to drive the input of the second buffer to a constant potential such that an output of the second buffer presents a constant state to the interface circuit.

9. The circuit of claim 6, wherein:

the first I/O control includes a first gated switch connected in series with the data-in line and controlled by the control logic circuit via a first primary control line, a first buffer connected in series between the first gated switch and the interface circuit with an output of the first buffer connected to the interface circuit and an input of the first buffer connected to the first gated switch, a first pull-down transistor connected in shunt between the first gated switch and the first buffer and controlled by the control logic circuit via a first secondary control line connected to a gate of the first pull-down transistor, and a first tri-state buffer connected in series with the data-out line and controlled by the control logic circuit via a first tertiary control line, the first tri-state buffer having an input connected to the interface circuit and an output connected to the first I/O pin;

the second I/O control includes a second gated switch connected in series with the clock-input line and controlled by the control logic circuit via a second primary control line, a second buffer connected in series between the second gated switch and the interface circuit with an output of the second buffer connected to the interface circuit and an input of the second buffer connected to the second gated switch, a second pull-down transistor connected in shunt between the second gated switch and the second buffer and controlled by the control logic circuit via a second secondary control line connected to a gate of the second pull-down transistor, and a RF buffer connected in series with the RF output line and controlled by the control logic circuit via a second tertiary control line, the RF buffer having an input connected to an output of the crystal oscillator and an output connected to the second I/O pin; and wherein the control logic circuit independently controls each of the gated switches, transistors, and tri-state buffers, via the control lines, to pass digital data on no more than one of the data-in line and the data-out line such that the first and second I/O pins are coupled to the circuit so as to communicate analog and digital signals in accordance with at least one of the mode selector switching signal and an action by an input command requesting data from the circuit.

10. The circuit of claim 2, wherein the first analog line is a RF output line coupled between a frequency output of the crystal oscillator and the first I/O control, and the second analog line is a DC warp line coupled between the second I/O pin and an input of the crystal oscillator, the first I/O control switchably connects the first I/O pin between the data-in line, the data-out line and the RF output line.

11. The circuit of claim 10, wherein:

the first I/O control includes a first gated switch connected in series with the data-in line and controlled by the control logic circuit via a first control line, a first tri-state buffer connected in series with the data-out line and controlled by the control logic circuit via a buffer control line, and a RF buffer connected in series with the RF output line and controlled by the control logic circuit via a RF buffer control line, the first tri-state buffer having an input connected to the interface circuit and an output connected to the first I/O pin, the RF buffer having an input connected to a frequency output of the crystal oscillator and an output connected to the first I/O pin, the first control line and buffer control line independently controlled by the control logic circuit to pass digital data on no more than one of the data-in and the data-out lines, the RF buffer control line operating to prevent the RF buffer from passing a signal when one of the data-in and data-out lines are passing digital data; and the second I/O control includes a second gated switch connected in series with the clock-input line and controlled by the control logic circuit via a second control line.

12. The circuit of claim 11, wherein:

the first I/O control includes a first buffer and a first pull-down transistor, the first buffer is connected in series between the first gated switch and the interface circuit, an output of the first buffer is connected to the interface circuit and an input of the first buffer is connected to the first gated switch, the first pull-down transistor is connected in shunt between the first gated switch and the first buffer, the first control line is commonly connected to the first gated switch and a gate of the first pull-down transistor, a substantially ground potential on the first control line causes the first gated switch to switch closed and the gate of the first transistor to be biased off and the first buffer to pass data in from the first I/O pin through the first gated switch to the interface circuit, a high potential on the first control line causes the first gated switch to be switched open and the gate of the first transistor to be biased to conduct so as to drive the input of the first buffer to a constant potential such that an output of the first buffer presents a constant state to the interface circuit; and the second I/O control includes a second buffer and a second pull-down transistor, the second buffer is connected in series between the second gated switch and the interface circuit, an output of the second buffer is connected to the interface circuit and an input of the second buffer is connected to the second gated switch, the second pull-down transistor is connected in shunt between the second gated switch and the second buffer, the second I/O control includes the second control line commonly connected to the second gated switch and a gate of the second pull-down transistor, a substantially ground potential on the second control line causes the second gated switch to switch closed, the gate of the second transistor to be biased off and the second buffer to pass digital signals in from the second I/O pin through the second gated switch to the interface circuit, a high potential on the second control line causes the second gate switch to be switched open and the gate of the second transistor to be biased to conduct so as to drive the input of the second buffer to a constant potential such that an output of the second buffer presents a constant state to the interface circuit.

13. The circuit of claim 10, wherein:

the first I/O control includes a first gated switch connected in series with the data-in line and controlled by the control logic circuit via a first primary control line, a first buffer connected in series between the first gated switch and the interface circuit with an output of the first buffer connected to the interface circuit and an input of the first buffer connected to the first gated switch, a first pull-down transistor connected in shunt between the first gated switch and the first buffer and controlled by the control logic circuit via a first secondary control line connected to a gate of the first pull-down transistor, a first tri-state buffer connected in series with the data-out line and controlled by the control logic circuit via a first tertiary control line, the first tri-state buffer having an input connected to the interface circuit and an output connected to the first I/O pin, and a RF buffer connected in series with the RF output line and controlled by the control logic circuit via a RF buffer control line which operates to prevent the RF buffer from passing a signal when one of the data-in and data-out lines are passing digital data, the RF buffer having an input connected to a frequency output of the crystal oscillator and an output connected to the first I/O pin; and the second I/O control includes a second gated switch connected in series with the clock-input line and controlled by the control logic circuit via a second primary control line, a second buffer connected in series between the second gated switch and the interface circuit with an output of the second buffer connected to the interface circuit and an input of the second buffer connected to the second gated switch, a second pull-down transistor connected in shunt between the second gated switch and the second buffer and controlled by the control logic circuit via a second secondary control line connected to a gate of the second pull-down transistor; and wherein the control logic circuit independently controls each of the gated switches, transistors, and tri-state buffers, via the control lines, to pass digital data on no more than one of the data-in line and the data-out line such that the first and second I/O pins are coupled to the circuit so as to communicate analog and digital signals in accordance with at least one of the mode selector switching signal and an action by an input command requesting data from the circuit.

14. A temperature compensated crystal oscillator circuit, comprising:

a crystal oscillator electrically coupled to a first and a second I/O pin via respective first and second analog lines;

a control logic circuit and a serial interface circuit electrically coupled to a digital serial data-in line, a digital serial data-out line, and a digital shift-clock-input line;

a first and a second I/O control having respective first and second control lines each of which are electrically coupled to the control logic circuit;

the first I/O control is electrically coupled to the first I/O pin and switchably connects the first I/O pin between the digital serial data-in line and the digital serial data-out line each of which are electrically coupled to the serial interface circuit;

the second I/O control is electrically connected to the second I/O pin and switchably connects the second I/O pin between a digital shift-clock-input line which is coupled to the serial interface circuit and an analog RF output line which is coupled to an output of the crystal oscillator, the crystal oscillator is adapted to receive an analog tuning signal from the first I/O pin via the first I/O control and a DC warp line which electrically connects the first I/O pin to the crystal oscillator;

the serial interface circuit is adapted to receive a digital serial data-in signal from the first I/O pin via the first I/O control, receive a control, and transmit a digital serial data-out signal to the first I/O pin via the first I/O control, the digital shift-clock-input signal for clocking the serial data-in and data-out signals into and out of the serial interface circuit;

a mode selector is electrically coupled to the control logic circuit, the mode selector generating a switching signal which directs the control logic circuit to switch the first and second I/O controls via the first and second control lines, respectively;

a first control potential generated by the mode selector causing the second I/O control to couple the analog output of the crystal oscillator to the second I/O pin; and a second control potential generated by the mode selector causing the first I/O control to couple the first and I/O pin to the serial interface circuit through one of the digital serial data-in and data-out lines, and causing the second I/O control to couple the digital shift-clock-input signal between the second I/O pin and the serial interface circuit.

15. The circuit of claim 14, wherein the mode selector consists of a threshold comparator having a first input connected to a reference voltage and a second input connected to a voltage sensing circuit which is coupled to a $V_{DD}$ pin, the comparator when sensing a $V_{DD}$ condition outside of a normal reference voltage range provides a switching signal at an output to the control logic circuit indicating that digital communication is desired.

16. The circuit of claim 14, wherein:

the first I/O control includes a first gated switch connected in series with the data-in line and controlled by the control logic circuit via the first control line and a first tri-state buffer connected in series with the data-out line and controlled by the control logic circuit via a buffer control line, the first tri-state buffer having an input connected to the serial interface circuit and an output connected to the first I/O pin; and the second I/O control includes a second gated switch connected in series with the clock-input line and a RF buffer connected in series with the RF output line, the second gated switch and RF buffer commonly controlled by the control logic circuit via the second control line, the RF buffer having an input connected to an output of the crystal oscillator and an output connected to the second I/O pin, a first control potential on the second control line causing the second gated switch to pass data and the RF buffer to substantially block a signal, a second control potential on the second control line causing the second gated switch to substantially block data and the RF buffer to pass a signal; and further comprising:

a normal operating mode wherein the control logic circuit operates to open the first gated switch and to cause the first tri-state buffer to substantially block digital data such that a signal on the first I/O pin passes to the crystal oscillator through the DC warp line, and wherein the control logic operates to open the second gated switch and to cause the RF buffer to pass signals from the crystal oscillator to the second I/O pin, whereby analog communication to the circuit is allowed; and a communication mode wherein the control logic circuit operates to close the first gated switch and to cause the first tri-state buffer to substantially block digital data such that a signal on the first I/O pin is allowed to pass to the serial interface circuit through the data-in line, and wherein the control logic operates to close the second gated switch and to cause the RF buffer to substantially block signals such that a clock signal from the second I/O pin passes to the serial interface via the clock-input line, the clock signals operating to clock data from the data-in line into the serial interface circuit, whereby digital communication to the circuit is allowed, a digital communication requesting data from the circuit causing the control logic circuit to operate to substantially open the first gated switch and to cause the first tri-state buffer to pass the requested data to the first I/O pin from the serial interface circuit through the data-out line, the clock signals on the clock-input line operating to clock data to the data-out line from the serial interface circuit, whereby digital communication from the circuit is allowed.

17. The circuit of claim 16, wherein the first control potential is substantially ground and the second control potential is a high potential relative to ground, and wherein:

the first I/O control includes a first buffer and a first pull-down transistor, the first buffer is connected in series between the first gated switch and the serial interface circuit, an output of the first buffer is connected to the serial interface circuit and an input of the first buffer is connected to the first gated switch, the first pull-down transistor is connected in shunt between the first gated switch and the first buffer, the first control line being connected to a gate of the first transistor, the first control potential being applied on the first control line causing the gate of the first transistor to be biased off and the first buffer to pass data in from the first I/O pin through the first gated switch to the serial interface circuit, the second control potential being applied on the first control line causing the gate of the first transistor to be biased to conduct so as to drive the input of the first buffer to a constant potential such that an output of the first buffer presents a constant state to the serial interface circuit; and the second I/O control includes a second buffer and a second pull-down transistor, the second buffer is connected in series between the second gated switch and the serial interface circuit, an output of the second buffer is connected to the serial interface circuit and an input of the second buffer is connected to the second gated switch, the second pull-down transistor is connected in shunt between the second gated switch and the second buffer, the second control line being connected to a gate of the second transistor, the first control potential being applied on the second control line causing the gate of the second transistor to be biased off and the second buffer to pass digital signals in from the second I/O pin through the second gated switch to the serial interface circuit, the second control potential being applied on the second control line causing the gate of the second transistor to be biased to conduct so as to drive the input of the second buffer to a constant potential such that an output of the second buffer presents a constant state to the serial interface circuit.

18. The circuit of claim 14, wherein:

the first I/O control includes a first gated switch connected in series with the data-in line and controlled by the control logic circuit via a first primary control line, a first buffer connected in series between the first gated switch and the serial interface circuit with an output of the first buffer connected to the serial interface circuit and an input of the first buffer connected to the first gated switch, a first pull-down transistor connected in shunt between the first gated switch and the first buffer and controlled by the control logic circuit via a first secondary control line connected to a gate of the first pull-down transistor, and a first tri-state buffer connected in series with the data-out line and controlled by the control logic circuit via a first tertiary control line, the first tri-state buffer having an input connected to the serial interface circuit and an output connected to the first I/O pin;

the second I/O control includes a second gated switch connected in series with the clock-input line and controlled by the control logic circuit via a second primary control line, a second buffer connected in series between the second gated switch and the serial interface circuit with an output of the second buffer connected to the serial interface circuit and an input of the second buffer connected to the second gated switch, a second pull-down transistor connected in shunt between the second gated switch and the second buffer and controlled by the control logic circuit via a second secondary control line connected to a gate of the second pull-down transistor, and a RF buffer connected in series with the RF output line and controlled by the control logic circuit via a second tertiary control line, the RF buffer having an input connected to an output of the crystal oscillator and an output connected to the second I/O pin;

the oscillator circuit having a normal operating mode wherein the control logic circuit operates to open the first and second gated switches, to bias the gates of the first and second pull-down transistors to cause the transistors to conduct so as to drive the input of the first and second buffer to a constant potential such that outputs of the buffers present a constant state to the serial interface circuit, and to cause the first tri-state buffer to substantially block digital data such that a signal on the first I/O pin passes to the crystal oscillator through the DC warp line, and wherein the control logic circuit operates to cause the RF buffer to pass signals from the crystal oscillator to the second I/O pin, whereby analog communication to the circuit is allowed; and the oscillator circuit having a communication mode wherein the control logic circuit operates to close the first and second gated switches, to cause the first tri-state buffer to substantially block digital data, to cause the RF buffer to substantially block signals, to bias the gates of the first and second pull-down transistors to cause the pull-down transistors to stop conducting so as to allow the first and second buffers to pass a digital signal from the first I/O pin to the serial interface through the data-in line and to pass a clock signal from the second I/O pin to the serial interface via the clock-input line, the clock signal operating to clock the digital signal from the data-in line into the serial interface circuit, whereby digital communication to the circuit is allowed, a digital communication requesting data from the circuit causes the control logic circuit to operate to substantially open the first gated switch and drive the first buffer to a constant state, and to cause the first tri-state buffer to pass the requested data to the first I/O pin from the serial interface circuit through the data-out line, the clock signal on the clock-input line operating to clock the requested data to the data-out line from the serial interface circuit, whereby digital communication from the circuit is allowed.

19. A method for providing multiplexed analog and digital communication on an I/O pin of a temperature compensated crystal oscillator, comprising the steps of:

providing a temperature compensated crystal oscillator including a power lead, an I/O pin, and a switching circuit having at least a first and second operating mode, the switching circuit being electrically coupled to the power lead and the I/O pin;

applying a first control potential to the power lead such that the switching circuit switches to the first operating mode which allows analog communication with the temperature compensated crystal oscillator on the I/O pin; and applying a second control potential to the power lead such that the switching circuit switches to the second operating mode which allows digital communication with the temperature compensated crystal oscillator on the I/O pin.

20. The method of claim 19, wherein the providing step includes a comparator circuit connected to the power lead and a reference voltage such that a potential on the power lead which is greater than the reference voltage causes the comparator to drive the switching circuit to switch to the first operating mode and a potential on the power lead which is less than the reference voltage causes the comparator to drive the switching circuit to switch to the second operating mode.

21. A communication device, comprising:

a receiver circuit;

a local oscillator circuit for generating local oscillator signals including a reference oscillator comprising:

a power lead, an I/O pin, and a switching circuit, the power lead coupled to the switching circuit and the switching circuit coupled to the I/O pin;

a first operating mode allowing analog communication with the reference oscillator via the I/O pin when a first signal is applied to the power lead to control the switching circuit; and a second operating mode allowing digital communication with the reference oscillator via the I/O pin when a second signal is applied to the power lead to control the switching circuit.

* * * * *

UNITED STATES PATENT AND TRADEMARK OFFICE
CERTIFICATE OF CORRECTION

PATENT NO.  : 5,724,009
DATED       : March 3, 1998
INVENTOR(S) : Collins, et al.

It is certified that error appears in the above-indentified patent and that said Letters Patent is hereby corrected as shown below:

Column 15, line 9 reads "first I/O pin via the first I/O control, receive a control, and transmit a digital serial data-out signal" should be -- first I/O pin via the first I/O control, receive a digital shift-clock-input signal from the second I/O pin via the second I/O control, and transmit a digital serial data-out signal--.

Column 15, line 24, reads "causing the first I/O control to couple the first and I/O pin to the serial interface circuit" should be --causing the first I/O control to couple the first I/O pin to the serial interface circuit--.

Signed and Sealed this

Fifteenth Day of December, 1998

Attest:

BRUCE LEHMAN

*Attesting Officer*            *Commissioner of Patents and Trademarks*